United States Patent [19]

Condreva

[11] Patent Number: 5,333,162
[45] Date of Patent: Jul. 26, 1994

[54] HIGH RESOLUTION TIME INTERVAL COUNTER

[75] Inventor: Kenneth J. Condreva, Livermore, Calif.

[73] Assignee: The United States of America as represented by the United States Department of Energy, Washington, D.C.

[21] Appl. No.: 22,578

[22] Filed: Feb. 23, 1993

[51] Int. Cl.$^5$ ................ H03K 21/02; H03K 21/08
[52] U.S. Cl. ........................ 377/20; 377/29; 377/49
[58] Field of Search ............. 377/20, 29, 49; 328/129.1

[56] References Cited

U.S. PATENT DOCUMENTS

| | | | |
|---|---|---|---|
| 3,541,448 | 11/1970 | Nutt | 324/186 |
| 3,656,060 | 4/1972 | Bauernfeind et al. | 377/20 |
| 3,714,464 | 1/1973 | Nutt | 307/235 |
| 4,303,983 | 12/1981 | Chaborski | 377/29 |
| 4,764,694 | 8/1988 | Winroth | 377/20 |
| 4,908,784 | 3/1990 | Box et al. | 377/20 |
| 4,912,734 | 3/1990 | Frauenglass | 377/20 |
| 5,027,298 | 6/1991 | Khazam | 377/20 |

OTHER PUBLICATIONS

J. Kostamovaara et al., "Time-To-Digital Converter With an Analog Interpolation Circuit", *Rev. Sci. Instrum.*, vol. 57, No. 11, pp. 2880–2885, Nov. 1986.
B. Turko, "A Picosecond Resolution Time Digitizer for Laser Ranging", *IEEE Transactions on Nuclear Science*, vol. NS-25, No. 1, pp. 75–80, Feb. 1978.
D. Porat, "Review of Sub-Nanosecond Time-Interval Measurements", *IEEE Transactions on Nuclear Science*, vol. NS-20, No. 5, pp. 36–42, Oct. 1973.

*Primary Examiner*—John S. Heyman
*Attorney, Agent, or Firm*—Luis M. Ortiz; James H. Chafin; William R. Moser

[57] ABSTRACT

A high resolution counter circuit measures the time interval between the occurrence of an initial and a subsequent electrical pulse to two nanoseconds resolution using an eight megahertz clock. The circuit includes a main counter for receiving electrical pulses and generating a binary word—a measure of the number of eight megahertz clock pulses occurring between the signals. A pair of first and second pulse stretchers receive the signal and generate a pair of output signals whose widths are approximately sixty-four times the time between the receipt of the signals by the respective pulse stretchers and the receipt by the respective pulse stretchers of a second subsequent clock pulse. Output signals are thereafter supplied to a pair of start and stop counters operable to generate a pair of binary output words representative of the measure of the width of the pulses to a resolution of two nanoseconds. Errors associated with the pulse stretchers are corrected by providing calibration data to both stretcher circuits, and recording start and stop counter values. Stretched initial and subsequent signals are combined with autocalibration data and supplied to an arithmetic logic unit to determine the time interval in nanoseconds between the pair of electrical pulses being measured.

17 Claims, 3 Drawing Sheets

HIGH RESOLUTION TIME INTERVAL COUNTER

RIGHTS OF THE GOVERNMENT

The Government has rights in this invention pursuant to Contract No. DE-AC04-76DP00789 awarded by the U.S. Department of Energy and American Telephone & Telegraph Company.

BACKGROUND OF THE INVENTION

1. Field of the Invention

The present invention relates generally to timing circuits and, more particularly, to a high density low power electrical circuit utilizing CMOS technology for measuring the time interval between the occurrence of an initial electrical pulse and a subsequent electrical pulse.

2. Description of the Prior Art

Generally speaking, size, weight and power consumption are of prime importance when designing electrical or electronic circuits. For example, airborne telemeter systems are continually driven by a need to use light-weight electronic circuits occupying minimum volume. In addition to physical size and weight considerations, electronic circuit power consumption must also be reduced both to reduce power supply volume and to minimize thermal effects due to electronic component heating. Because size, weight and power consumption requirements are often difficult to control in combination within the same electronic circuit, tradeoffs in circuit design are often made which result in less-than-optimum circuit performance.

The time interval counter is an example of an electronic circuit or device used in many industrial and military applications but which currently performs in a less-than-optimum manner because of difficulties in balancing device size, weight and power consumption requirements. As known in the art, the time interval counter is an electronic device operable to provide a measure of the time interval between the occurrence of a first electrical signal or pulse and a second, subsequent electrical signal or pulse. One of the major reasons why time interval counters presently in use perform less than satisfactorily is because the methods used to determine the time interval between electrical signals make it difficult to efficiently balance circuit size, weight and power consumption. In many systems of interest, time interval counters are required which are operable to perform time interval measurements of up to ten microseconds in duration with less than five nanoseconds of accuracy. The traditional method for making this measurement utilizes a counter circuit which counts clock pulses of a frequency sufficiently high to achieve the desired resolution (greater than two hundred megahertz). The counter is enabled with the first timing pulse and disabled with the second timing pulse. One of the characteristics of electronic circuits capable of operating at greater than two hundred megahertz resolution is extremely high power consumption, which is undesirable for many time interval counter applications. Other time interval determination methods use various techniques to allow the use of a lower frequency clock, e.g., time to pulse height converters, linear pulse stretchers and vernier techniques, but these suffer from high power requirement problems and have insufficient dynamic range for the requirements of many time interval measurement applications. Circuits using the above methods have been described in the open literature. However, these circuits were designed for radiation counting experiments requiring five to twenty picosecond resolution, and implementation is achieved utilizing discrete transistors and Emitter Coupled Logic (ECL) integrated circuits. Little consideration is given in this application to minimizing volume and power consumption, and the circuit topologies used are not optimized for implementation in low power Complimentary Metal Oxide Semiconductor (CMOS) logic, which would greatly reduce the overall size of the circuit. The problem with power dissipation is further exacerbated if efforts are made to provide compensation circuits to correct for other circuit problems such as component tolerances and temperature drift.

Consequently, a need exists for an improved time interval counter which overcomes the shortcomings of the prior art. In particular, there is a need for a time interval counter which utilizes an apparatus and method for determining the time interval between electronic pulses that allow an optimum balance to be achieved between measurement accuracy and circuit size, weight and power consumption requirements.

SUMMARY OF THE INVENTION

The present invention relates to a high resolution time interval counter designed to satisfy the aforementioned needs. More particularly, the present invention is directed to a time interval counter which is capable of providing a measurement of arbitrarily long time intervals with high resolution and may be assembled with relatively low speed, low power, inexpensive high density CMOS technology. Specifically, the present invention provides measurement of time intervals of up to thirty-two microseconds in duration with two nanoseconds of resolution and four nanoseconds of accuracy while utilizing an eight megahertz clock.

Accordingly, the present invention is directed to a high resolution counter circuit for measuring the time interval between the occurrence of an electrical pulse A and the occurrence of a subsequent electrical pulse B. The circuit utilizes a clock circuit for generating a plurality of clock pulses in serial fashion, and includes: (a) an input circuit for receiving the electrical pulses A and B and the plurality of clock pulses; (b) a main counter circuit for receiving the electrical pulses A and B and the plurality of clock pulses from the input circuit and generating therefrom an eight bit binary output word (NCOUNT) which is a measure of the number of clock pulses occurring between electrical pulses A and B; (c) a first pulse stretcher circuit for receiving the electrical pulse A and the plurality of clock pulses from the input circuit and generating therefrom an output signal (OUTA) whose width is proportional to the time between the receipt of the electrical pulse A and the receipt of the second subsequent clock pulse; (d) a second pulse stretcher circuit for receiving the electrical pulse B and the plurality of clock pulses from the input circuit and generating therefrom an output signal (OUTB) whose width is proportional to the time between the receipt of the electrical pulse B and the second subsequent clock pulse; (e) a start counter circuit for receiving the output signal OUTA from the first pulse stretcher circuit and generating an eight bit binary word NSTART therefrom which is a measure of the width of the output signal OUTA; (f) a stop counter circuit for receiving the output signal OUTB from the second pulse stretcher circuit and generating an eight bit binary word NSTOP therefrom which is a measure of the width of the output signal OUTB; (g) an autocalibration circuit for correcting errors with the first and second pulse stretcher circuits; and (h) an arithmetic circuit for receiving the signals NCOUNT, NSTART, NSTOP and autocalibration data and computing the time interval T(A-B) between the electrical pulse A and the electrical pulse B.

The dual pulse stretcher circuitry of the present invention utilizes an interpolator circuit design which utilizes a simple CMOS inverter and analog switch as a comparator by implementing an autobalance technique. A large stretching factor achieved by this interpolator design allows for the use of a low frequency clock required by CMOS technology applications. Minimal physical volume of printed circuit board area is required by implementation of the stretcher circuit. All circuitry is contained within a forty-four pin grid array CMOS integrated circuit and a twenty-six lead flat pack hybrid microcircuit. The maximum combined operating power of both of these parts is one hundred and fifty milliwatts.

These and other features and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

In the course of the following detailed description, reference will be made to the attached drawings in which.

DETAILED DESCRIPTION OF THE INVENTION

The present invention is directed to a high resolution low power time interval counter, having sub-nanosecond measurement accuracy potential, which uses relatively low speed, low power, inexpensive high density CMOS technology. The high resolution time interval counter is illustrated in block diagram form in FIG. 1 and is generally designated by the numeral 10. The time interval counter 10 is operable to receive a pair of electrical pulses A and B which are separated in time and determine the time interval between the occurrence of the electrical pulse A and the electrical pulse B. The pair of electrical pulses A and B are provided to the time interval counter 10 on the pair of input lines 12 and 14. Although the time interval counter 10 will be described herein as being operable to provide a measure of the time interval between the occurrence of electrical pulse A and the occurrence of a subsequent electrical pulse B, it should be understood that electrical pulse B may occur first in time.

Figure 2:
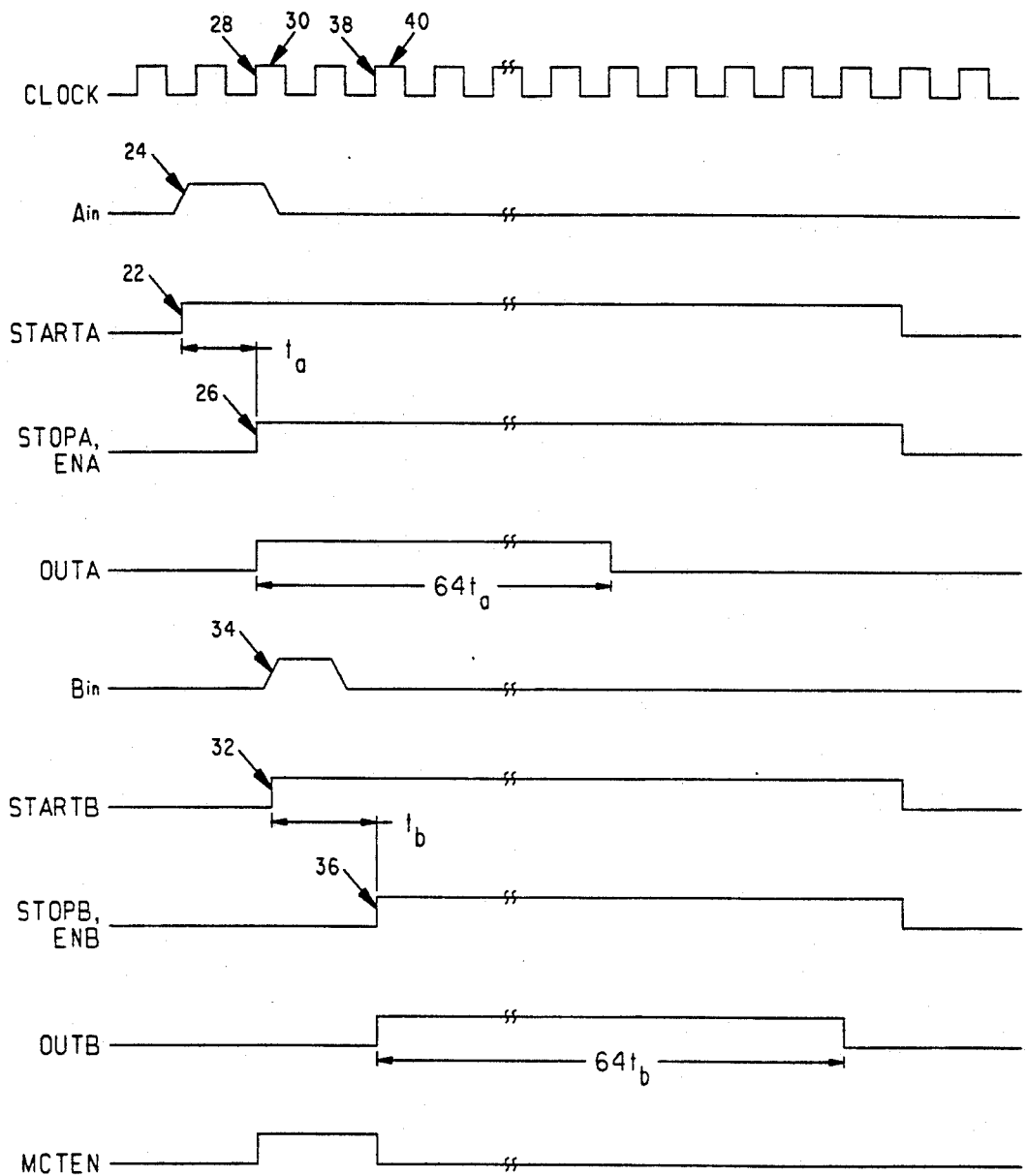
FIG. 2 is a graph illustrating various electrical waveforms generated by the time interval counter of the present invention.

The time interval counter 10 includes an input circuit block 16 for receiving the pair of electrical pulses A and B illustrated in FIG. 2 and designated as $A_{in}$ and $B_{in}$. The input circuit block 16 also receives a series of clock pulses delivered by an external eight (8) megahertz clock circuit 17. The clock pulse waveform is illustrated in FIG. 2 and designated as "clock". The input circuit block 16 is operable to generate three output signals STARTA, STOPA and ENA from the input electrical pulse A. The STARTA, STOPA and ENA output signals are illustrated in FIG. 2. The input circuit block 16 also generates three output signals STARTB, STOPB and ENB from the input electrical pulse B. The STARTB, STOPB and ENB signals are also illustrated in FIG. 2.

As seen from an analysis of the waveforms of FIG. 2, the input circuit block 16 generates a STARTA pulse having a rectangular shape and a rising edge 22 which coincides with the rising edge 24 of the electrical pulse $A_{in}$. The input circuit block 16 generates a STOPA pulse having a rectangular shape and a rising edge 26 which coincides with the rising edge 28 of the clock pulse 30. Clock pulse 30 is the second clock pulse to occur after the rising edge 24 of $A_{in}$. The rising edge 26 of the STOPA signal occurs a time $t_a$ after the rising edge 22 of the STARTA pulse. As further seen in FIG. 2, the input circuit block 16 generates a STARTB pulse having a rectangular shape and a rising edge 32 which coincides with the rising edge 34 of the electrical pulse $B_{in}$. The input circuit block 16 generates a STOPB pulse having a rectangular shape and a rising edge 36 which coincides with the rising edge 38 of the clock pulse 40. The clock pulse 40 is the second clock pulse to occur after the rising edge 34 of Bin. The rising edge 36 of the STOPB signal occurs a time $t_b$ after the rising edge 32 of the STARTB pulse.

Figure 3:
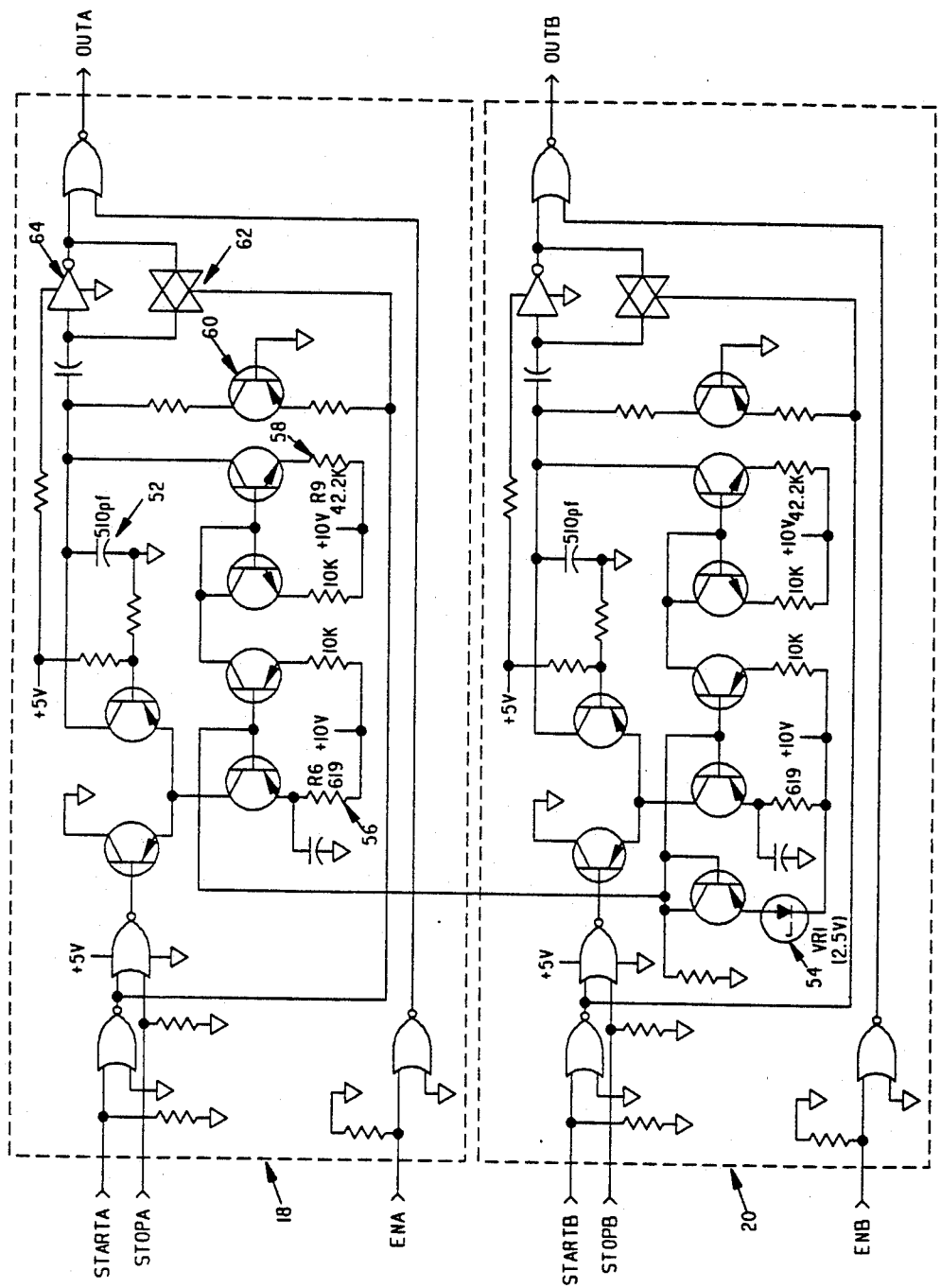
FIG. 3 is a schematic illustration of a dual channel pulse stretcher circuit which forms a portion of the time interval counter of the present invention.

Output signals STARTA, STOPA and ENA generated by the input circuit block 16 are provided to a pulse stretcher circuit 18. As will be explained later in greater detail with respect to FIG. 3, the pulse stretcher circuit 18 provides an output pulse OUTA whose width is proportional to the time between the rising edge 24 of the electrical pulse $A_{in}$ and the rising edge 28 of the clock pulse 30 which is the second clock pulse after the pulse $A_{in}$ rising edge 24, $t_a$. The pulse stretcher 18 illustrated in FIG. 3 is designed to provide an output pulse OUTA whose width is approximately sixty four (64) times the width of $t_a$.

The output signals STARTB, STOPB and ENB generated by the input circuit block 16 are provided to a pulse stretcher circuit 20. As will be explained later in greater detail with respect to FIG. 3, the pulse stretcher 20 provides an output pulse OUTB whose width is proportional to the time between the rising edge 34 of the electrical pulse $B_{in}$ and the rising edge 38 of the clock pulse 40 which is the second clock pulse after the pulse $B_{in}$ rising edge 34. The pulse stretcher 20 illustrated in FIG. 3 is designed to provide an output pulse OUTB whose width is approximately sixty four (64) times the width of $t_b$.

The OUTA signal generated by the pulse stretcher 18 is provided to a start counter 42. The start counter 42 is operable to measure the width of the OUTA signal and provide as its output an eight (8) bit binary word NSTART representative of this measured width. The OUTB signal generated by the pulse stretcher 20 is provided to a stop counter 44. The stop counter 44 is operable to measure the width of the OUTB signal and provide as its output an eight (8) bit binary word NSTOP representative of this measured width.

Both the NSTART and NSTOP signals are provided to an arithmetic logic unit (ALU) 46. Also provided to the arithmetic logic unit 46 is a binary word NCOUNT generated by a main counter 48. The NCOUNT signal is a measure of the number of eight (8) megahertz clock pulses occurring between the rising edge 24 of the electrical pulse $A_{in}$ and the rising edge 34 of the electrical pulse $B_{in}$. Calibration errors are corrected within autocalibration block 50 by providing precise input pulse sequences to both pulse stretchers 18 and 20. First, a time delay of exactly one (1) clock period (one hundred twenty five (125) nanoseconds) is input, producing start and stop counter readings STRT(125) and STOP(125), respectively. Then, a time delay of exactly two (2) clock periods is generated (two hundred and fifty (250) nanoseconds), producing readings STRT(250) and STOP(250). These readings are stored and used by the arithmetic logic unit 46 during a time interval measurement. Within the arithmetic logic unit 46, the time interval T(A-B) representative of the time interval between the occurrence of the electrical pulse A and the occurrence of the subsequent electrical pulse B is calculated. The time interval T(A-B), expressed in nanoseconds, is determined by the formula:

$$T(A-B) = \left[ NCOUNT + \frac{NSTART-STRT(125)}{STRT(250)-STRT(125)} - \frac{NSTOP-STOP(125)}{STOP(250)-STOP(125)} \right] * 125.$$

A unique aspect of the time interval counter 10 of the present invention is that the time interval counter 10 has a dual interpolator circuit (one interpolator circuit for each pulse stretcher circuit) which performs interpolation of the time interval, $t_a$, between the electrical pulse $A_{in}$ and the rising edge 28 of the clock pulse 30 which is the second clock pulse to occur after the pulse $A_{in}$ rising edge 24, and also performs interpolation of the time interval, $t_b$, between the electrical pulse $B_{in}$ and the rising edge 38 of the clock pulse 40 which is the second clock pulse to occur after the pulse $B_{in}$ rising edge 34. The physical size of the time interval counter 10 is minimized because the input circuit block 16, start counter 42, stop counter 44, arithmetic logic unit 46, main counter 48 and autocalibration block 50 are all formed on a single forty four (44) pin grid array completely using CMOS technology, such as the UT160D chip manufactured by United Technologies. CMOS technology is employed in the pulse stretcher and other respective circuits to minimize power consumption. Also, both pulse stretchers 18 and 20 are implemented on a single twenty six (26) lead flat pack hybrid microcircuit. The total operating power for both the UT160D chip and the hybrid is limited to two hundred (200) milliwatts.

Figure 1:
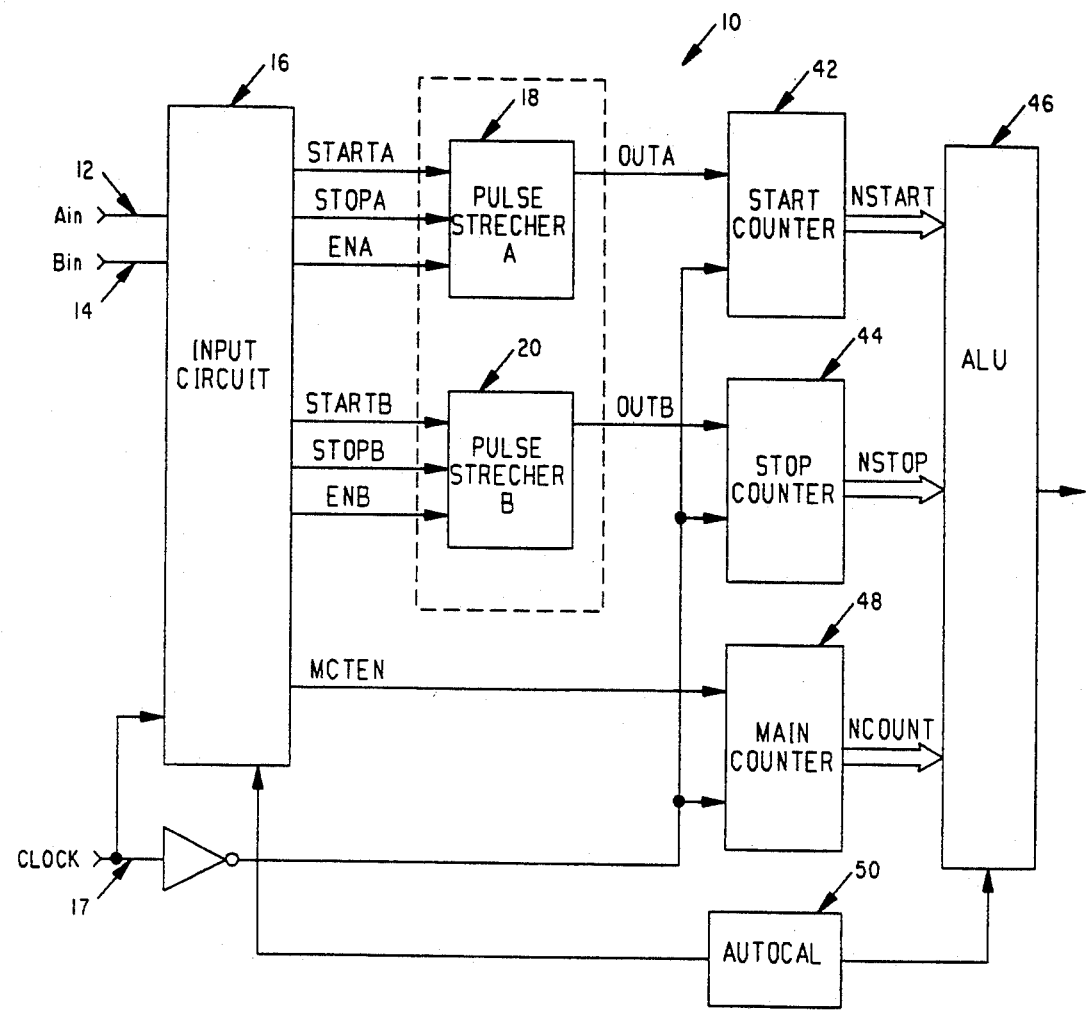
FIG. 1 is a schematic illustration in block diagram form of the high resolution time interval counter of the present invention.

Although the individual logic circuits forming the input circuit block, the various counters and the arithmetic logic unit are not specifically illustrated in FIG. 1, and the logic circuits required to form the time interval counter 10 may be deduced from an examination of the waveforms illustrated in FIG. 2., there is illustrated at FIG. 3 a schematic diagram of the identically configured pulse stretchers 18 and 20 described with respect to FIG. 1.

Several novel features of the interpolator circuit are also illustrated in FIG. 3. First, rather than using a high speed, typically high power, voltage comparator, the invention incorporates a simple CMOS inverter 64 and an analog switch 62 as a comparator by implementing an autobalance technique. This technique significantly lowers power consumption of the circuit without affecting accuracy. Also, both critical matching transistor characteristics and temperature compensation of the interpolator circuit is not required because of the autocalibration feature of the invention implemented within the gate array. Finally, the large stretching factor (N) of this interpolator allows use of a clock of sufficiently low frequency to permit implementation of CMOS technology. These features permit a simpler interpolator design that requires fewer components, therefore lending itself to high circuit density design and low operating power. The resulting circuit has potential measurement accuracy of 100 picoseconds, while maintaining both low operating power (200 mW) and minimal physical volume (2 square inches) of printed circuit board area.

Referring to FIG. 3, operation of pulse stretcher 18 is as follows. The STARTA signal which is an input to the pulse stretcher 18 is a generally rectangular pulse whose rising edge 22 or low to high transition, refer to FIG. 2, is driven by the first time interval input, which in this case is the electrical pulse $A_{in}$. Both the STOPA and ENA rising edge or low to high transition 26 are driven by the second eight megahertz clock pulse 30 rising edge 28 following the occurrence of the STARTA electronic pulse.

During the interval between the STARTA and STOPA rising edges 22 and 26, the capacitor 52 is charged by current source VR1/R6−VR1/R9 (VR1, R6 and R9 designated by the numerals 54, 56 and 58, respectively). Also, transistor 60 is turned off and analog switch 62 is opened. Inverter 64, which was biased between logic levels by feedback from the analog switch 62, will switch to a low state as 52 charges. OUTA, the output signal from the pulse stretcher 18, will go high on the rising edge 26 of STOPA and ENA. After STOPA goes high, the capacitor 52 is discharged by the current source VR1/R9. When the voltage across the capacitor 52 returns to the initial value, the output of inverter 64 will go high and OUTA will go low. Since the charging current of the capacitor 52 is approximately R9/R6 times the discharge current, the OUTA pulse width will be approximately sixty four (64) times the time difference between the rising edge 22 of STARTA and the rising edge 26 of STOPA. The formula for the pulse width stretching factor N, is given by:

$$N=(R9/R6)*[1-(Vt/VR1)*Ln(R9/R6)];$$

where $Vt=kT/q=26$ millivolts at room temperature.

The OUTA signal generated by the pulse stretcher 18 is illustrated in FIG. 2.

The pulse stretcher 20 illustrated in FIG. 3 operates in an identical manner as the pulse stretcher 18, with the STARTB rising edge 32 being driven by the second time interval input, which in this case is the electrical pulse $B_{in}$. Both the STOPB and ENB signals are driven by the leading edge 38 of the second eight megahertz clock pulse 40 following STARTB. The width of the OUTB pulse will also be approximately sixty four (64) times the time difference between the rising edge 32 of STARTB and the rising edge 36 of STOPB.

Again referring to FIG. 1, and as stated previously, calibration errors are corrected within autocalibration block 50 by providing precise input pulse sequences through both pulse stretchers 18 and 20. Readings obtained by the arithmetic logic circuit 46 are stored and used by the arithmetic logic unit during a time interval measurement using the provided formula. The autocalibration circuit 50 is coupled to the arithmetic logic circuit 46 in order to inform the logic circuit 46 when autocalibration data is being sent through stretchers 18 and 20. This coupling allows the logic circuit 46 to distinguish between signals related to pulses A and B, and calibration data used by the logic circuit 46 to calibrate signals received through stretcher circuits 18 and 20.

It is thought that the present invention and many of its attendant advantages will be understood from the foregoing description and it will be apparent that various changes may be made in the form, construction and arrangement of the parts of the invention described herein without departing from the spirit and scope of the invention or sacrificing all of its material advantages, the form hereinbefore described being merely a preferred or exemplary embodiment thereof.

I claim:

1. A high-resolution low-power time interval counter circuit for measuring the time interval between the occurrence of an initial electrical pulse and a subsequent electrical pulse, comprising:
    a) an input circuit means for receiving said initial electrical pulse, said subsequent electrical pulse, a plurality of clock pulses from a clock signal generating means, and a precise set of timing pulses for generating plural output electrical signals;
    b) a first pulse stretcher circuit means for receiving a first series of said electrical signals from said input circuit means, and for generating a first stretched electrical signal therefrom;
    c) a second pulse stretcher circuit means for receiving a second series of said electrical signals from said input circuit means, and for generating a second stretched electrical signal therefrom;
    d) an autocalibration circuit means for calibrating said first and said second pulse stretcher circuit means prior to said input circuit means receiving said initial and said subsequent electrical pulses, said autocalibration circuit provides said precise set of timing pulses through said input circuit for said stretcher circuits and then to a plurality of counting means for providing time interval data; and
    e) an arithmetic logic circuit wherein said precise set of timing pulses are used as calibration data by said arithmetic logic circuit to correct inaccuracies in time measurement of said stretcher circuits, and wherein said arithmetic logic circuit is responsive to said time interval data from said plurality of counting circuit means that receive said first and said second stretched electrical signals and determines the time interval between said initial and said subsequent electrical pulses based on said calibration data and said stretched electrical signals.

2. The time interval counter circuit of claim 1, wherein said pulse stretcher circuits each employ:
    a CMOS inverter for the reduction of power consumption; and
    an analog switch in combination to form a comparator through the implementation of an autobalance technique.

3. The time interval counter circuit of claim 1 wherein said clock signal generating means generates said plurality of clock pulses at a frequency of eight (8) megahertz.

4. The time interval counter circuit of claim 1, wherein said pulse stretcher circuits are linear circuits configured to provide said output signals with a width approximately sixty-four (64) times greater than the time between receipt of a START pulse and a STOP pulse wherein said START and STOP pulses comprise part of said first and said second series of input pulses received by said stretcher circuits.

5. The time interval counter circuit of claim 4, wherein said plurality of counting circuit means generates counter signals responsive to said first and second stretcher circuits signals and a timing signal from said input circuit.

6. The time interval counter circuit of claim 1, wherein the maximum overall circuit operating power consumption is two hundred milliwatts.

7. The time interval counter circuit of claim 6, wherein the plurality of counter circuits are formed onto a CMOS gate array implemented as a forty-four pin grid array, and a hybrid microcircuit implemented as a twenty-six lead flat pack.

8. The time interval counter circuit of claim 1, wherein said autocalibration circuit is further coupled to a logic circuit for allowing said arithmetic logic circuit to distinguish between said calibration data and said plurality of counter pulses from said plurality of counting circuit means.

9. A high-resolution low-power time interval counter circuit for measuring the time interval between the occurrence of an initial and a subsequent electrical pulse, comprising:
    a) an input circuit means for receiving said initial and said subsequent electrical pulses, for receiving a plurality of clock pulses from a clock generating means, and for receiving precise timing pulses for generating calibration data;
    b) a dual pulse stretcher circuit coupled to said input means, further comprising;
        i) a first pulse stretcher circuit for receiving a first electrical signal, related to said initial pulse or to said calibration data where said first pulse stretcher generates a first stretched signal therefrom;
        ii) a second pulse stretcher circuit for receiving a second electrical signal, related to said second pulse or said calibration data where said second pulse stretcher generates a second stretched signal therefrom;
    c) a plurality of counting circuits coupled to said clock generator means for providing START, STOP, and NCOUNT data from said input circuit means and said dual pulse stretcher circuit;
    d) an autocalibration circuit coupled to said input means for correcting measurement errors within said first and second pulse stretcher circuits prior to receipt of said electrical pulses by said input means; and
    e) an arithmetic logic circuit coupled to said autocalibration circuit and to said plurality of counting circuits wherein said arithmetic logic circuit receives and distinguishes between, and separately stores a series of calibration pulses, said START count data, said STOP count data, and said NCOUNT count data, wherein said arithmetic logic circuit determines the time interval between said initial and said subsequent electrical pulses based on an analysis of said received count data.

10. The counter circuit of claim 9, wherein:
said clock generating means generates said plurality of clock pulses at a frequency of eight (8) megahertz;
said pulse stretcher circuits are linear circuits configured to provide said output signals with a width approximately sixty-four (64) times greater than the time between receipt of said electrical pulses and the receipt of said subsequent clock pulses;
the maximum overall circuit operating power consumption is two hundred milliwatts; and
the counter circuit is formed onto a CMOS gate array implemented as a forty-four pin grid array, and a hybrid microcircuit implemented as a twenty-six lead flat pack.

11. A high resolution counter circuit utilizing a clock circuit for generating a plurality of clock pulses in serial fashion and operable to measure the time interval between the occurrence of an electrical pulse A and the occurrence of a subsequent electrical pulse B, comprising:
(a) input circuit means for receiving said electrical pulses A and B and said plurality of clock pulses;
(b) a main counter circuit coupled to said input circuit means wherein said main counter circuit generates a binary word NCOUNT which is a measure of the number of clock pulses occurring between a rising edge A of said electrical pulse A and a rising edge B of said electrical pulse B;
(c) a first pulse stretcher circuit for receiving said electrical pulse A wherein said first pulse stretcher circuit generates therefrom an output signal OUTA whose width is proportional to a time difference between the leading edge of said electrical pulse A and a subsequent timing pulse;
(d) a second pulse stretcher circuit for receiving said electrical pulse B and generating therefrom an output signal OUTB whose width is proportional to the time between the receipt of said electrical pulse B and the receipt of the second subsequent clock pulse;
(e) a start counter circuit for receiving said output signal OUTA from said first pulse stretcher circuit and generating a binary word NSTART therefrom which is a measure of the width of said output signal OUTA;
(f) a stop counter circuit for receiving said output signal OUTB from said second pulse stretcher circuit and generating a binary word NSTOP therefrom which is a measure of the width of said output signal OUTB;
(g) an autocalibration circuit for correcting measurement errors within said first and second pulse stretcher circuits and generating calibration data STRT(125), STRT(250), STOP(125) and STOP(250), wherein said autocalibration circuit is coupled to said input circuit and an arithmetic logic circuit;
(h) an arithmetic logic circuit for receiving said signals NCOUNT, NSTART and NSTOP and said calibration data STRT(125), STRT(250), STOP(125) and STOP(250), and determining the time interval T(A-B) between said electrical pulse A and said electrical pulse B according to the formula:

$$T(A-B) = \left[ NCOUNT + \frac{NSTART-STRT(125)}{STRT(250)-STRT(125)} - \frac{NSTOP-STOP(125)}{STOP(250)-STOP(125)} \right] * 125.$$

12. The counter circuit as recited in claim 11, wherein:
each of said electrical pulses A and B is a generally rectangular pulse having a rising edge and a trailing edge; and
said main counter generates said output signal NCOUNT as a measure of the number of clock pulses occurring between the rising edge of electrical pulse A and the rising edge of electrical pulse B.

13. The counter circuit as recited in claim 11, wherein:
each of said electrical pulses A and B and said plurality of clock pulses is a generally rectangular pulse having a rising edge and a trailing edge;
said first pulse stretcher circuit provides said output signal OUTA whose width is proportional to the time between the rising edge of said electrical pulse A the rising edge of the second subsequent clock pulse; and
said second pulse stretcher circuit provides said output signal OUTB whose width is proportional to the time between the rising edge of said electrical pulse B and the rising edge of the second subsequent clock pulse.

14. The counter circuit as recited in claim 11, wherein said clock circuit generates said plurality of clock pulses at a frequency of eight (8) megahertz.

15. The counter circuit as recited in claim 11, wherein said first pulse stretcher circuit is a linear circuit configured to provide said output signal OUTA with a width approximately sixty four (64) times greater than the time between the receipt of said electrical pulse A and the receipt of the second subsequent clock pulse.

16. The counter circuit as recited in claim 11, wherein said second pulse stretcher circuit is a linear circuit configured to provide said output signal OUTB with a width approximately sixty four (64) times greater than the time between the receipt of said electrical pulse B and the receipt of the second subsequent clock pulse.

17. The counter circuit as recited in claim 11, wherein said high resolution counter circuit is formed onto a CMOS gate array implemented as a forty-four pin grid array and a hybrid microcircuit implemented as a twenty six lead flat pack having an operating power consumption of two hundred milliwatts maximum.

* * * * *